(12) United States Patent
Hekmatshoartabari

(10) Patent No.: US 10,347,667 B2
(45) Date of Patent: Jul. 9, 2019

(54) THIN-FILM NEGATIVE DIFFERENTIAL RESISTANCE AND NEURONAL CIRCUIT

(71) Applicant: INTERNATIONAL BUSINESS MACHINES CORPORATION, Armonk, NY (US)

(72) Inventor: Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/660,305

(22) Filed: Jul. 26, 2017

(65) Prior Publication Data

US 2019/0035822 A1  Jan. 31, 2019

(51) Int. Cl.
*H01L 29/66* (2006.01)
*H01L 27/12* (2006.01)
(Continued)

(52) U.S. Cl.
CPC .... *H01L 27/1251* (2013.01); *H01L 21/28525* (2013.01); *H01L 21/28531* (2013.01);
(Continued)

(58) Field of Classification Search
CPC . H01L 27/1251; H01L 29/66234–6625; H01L 21/283; H01L 29/7317;
(Continued)

(56) References Cited

U.S. PATENT DOCUMENTS 5,266,820 A * 11/1993 Van Berkel ............. H01L 27/12
                                                              257/300
5,416,031 A    5/1995 Miwa
(Continued)

OTHER PUBLICATIONS

Hekmatshoar et al., "Heterojunction bipolar transistors with hydrogenated amorphous silicon contacts on crystalline silicon," Eletronics Letters. vol. 48, No. 18. Aug. 20, 2012. pp. 1-2.
(Continued)

*Primary Examiner* — Eric A. Ward
*Assistant Examiner* — Eric K Ashbahian
(74) *Attorney, Agent, or Firm* — Tutunjian & Bitetto, P.C.; Erik Johnson

(57) ABSTRACT

A method is presented for forming a monolithically integrated semiconductor device. The method includes forming a first device including first hydrogenated silicon-based contacts formed on a first portion of a semiconductor material of an insulating substrate and forming a second device including second hydrogenated silicon-based contacts formed on a second portion of the semiconductor material of the insulating substrate. Source and drain contacts of the first device are formed before a gate contact of the first device and a gate contact of the second device is formed before the emitter and collector contacts of the second device. The first device can be a heterojunction field effect transistor (HJFET) and the second device can be a (heterojunction bipolar transistor) HBT. The HJFET and the HBT are integrated in a neuronal circuit and create negative differential resistance by forming a lambda diode.

5 Claims, 15 Drawing Sheets

(51) Int. Cl.
*H01L 21/84* (2006.01)
*H01L 23/532* (2006.01)
*H01L 23/522* (2006.01)
*H01L 29/45* (2006.01)
*H01L 29/40* (2006.01)
*H01L 21/285* (2006.01)
*H03K 17/567* (2006.01)
*H03K 17/70* (2006.01)
*H01L 29/80* (2006.01)
*H01L 29/737* (2006.01)
*H01L 21/3213* (2006.01)
*G06N 3/063* (2006.01)

(52) U.S. Cl.
CPC ........ *H01L 21/28556* (2013.01); *H01L 21/84* (2013.01); *H01L 23/5226* (2013.01); *H01L 23/53271* (2013.01); *H01L 29/401* (2013.01); *H01L 29/458* (2013.01); *H01L 29/66234* (2013.01); *H03K 17/567* (2013.01); *H03K 17/70* (2013.01); *G06N 3/063* (2013.01); *H01L 21/32134* (2013.01); *H01L 21/32137* (2013.01); *H01L 29/737* (2013.01); *H01L 29/802* (2013.01)

(58) Field of Classification Search
CPC ....... H01L 29/1004–1008; H01L 29/73–7378; H01L 21/28525; H01L 21/28531; H01L 21/28556
See application file for complete search history.

(56) References Cited

U.S. PATENT DOCUMENTS

| | | | |
|---|---|---|---|
| 6,400,002 B1 | 6/2002 | Wu et al. | |
| 7,772,653 B1 | 8/2010 | Foote et al. | |
| 8,486,797 B1 | 7/2013 | Hekmatshoartabari et al. | |
| 8,872,231 B2* | 10/2014 | Ichikawa | H01L 27/0605 257/192 |
| 8,889,529 B2 | 11/2014 | Hekmatshoar-Tabari et al. | |
| 8,906,755 B1* | 12/2014 | Hekmatshoartabari | H01L 27/326 438/152 |
| 9,064,924 B2 | 6/2015 | Hekmatshoar-Tabari et al. | |
| 9,093,548 B2 | 7/2015 | Hekmatshoar-Tabari et al. | |
| 2006/0030113 A1* | 2/2006 | Miyajima | H01L 29/66318 438/312 |
| 2006/0049460 A1* | 3/2006 | Chen | H01L 21/82380 257/347 |
| 2011/0180789 A1 | 7/2011 | Han et al. | |
| 2012/0210932 A1 | 8/2012 | Hekmatshoar-Tabari et al. | |
| 2012/0235151 A1* | 9/2012 | Cai | H01L 29/66242 257/65 |
| 2013/0249862 A1* | 9/2013 | Xu | H02J 3/00 345/174 |
| 2014/0224306 A1 | 8/2014 | Chen et al. | |
| 2014/0342478 A1* | 11/2014 | Choi | H01L 29/41733 438/23 |
| 2015/0093872 A1* | 4/2015 | Chan | H01L 29/66242 438/312 |
| 2015/0179797 A1* | 6/2015 | Yin | H01L 29/66636 257/192 |
| 2015/0287642 A1* | 10/2015 | Chang | H01L 21/8249 438/236 |
| 2016/0112035 A1* | 4/2016 | Kurokawa | H03K 3/012 326/93 |
| 2017/0125607 A1 | 5/2017 | Hekmatshoar-Tabari et al. | |

OTHER PUBLICATIONS

Hekmatshoar et al., "Thin-Film Heterojunction Field-Effect Transistors With Crystalline Si Channels and Low-Temperature PECVD Contacts," IEEE Electron Device Letters. vol. 35. No. 1. Jan. 2014. pp. 81-83.

Hekmatshoar et al., "Thin-Film Silicon Heterojunction FETs for Large Area and Flexible Elecronics: Design Parameters and Reliability," IEEE Transactions on Electron Devices. vol. 62, No. 11. Nov. 2015. pp. 3524-3529.

Ignatov et al., "A memristive spiking neuron with firing rate coding," Frontiers in Neuroscience. vol. 9. Article 376. Oct. 20, 2015. pp. 1-9.

Pickett et al., "A scalable neuristor built with Mott memristors," Letters. Nature Materials. vol. 12. Published on-line: Dec. 16, 2012. pp. 114-117.

Office Action with cited art in corresponding U.S. Appl. No. 15/830,639 dated Jan. 31, 2019 (21 Pgs.).

\* cited by examiner

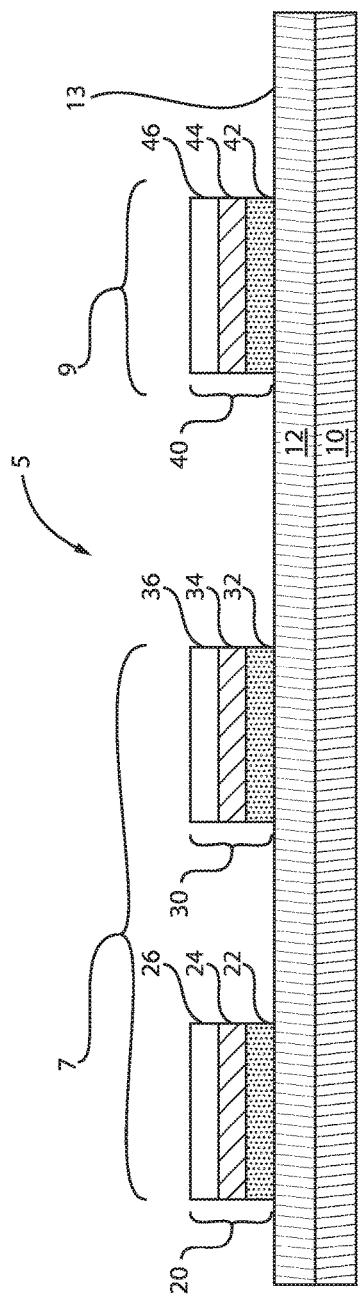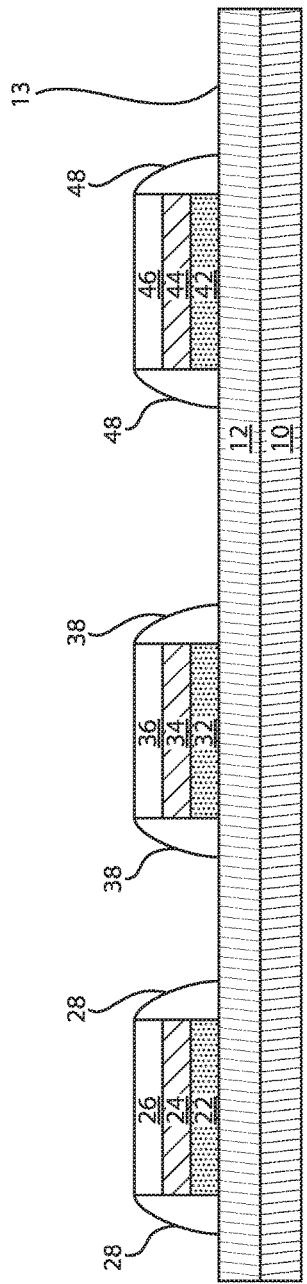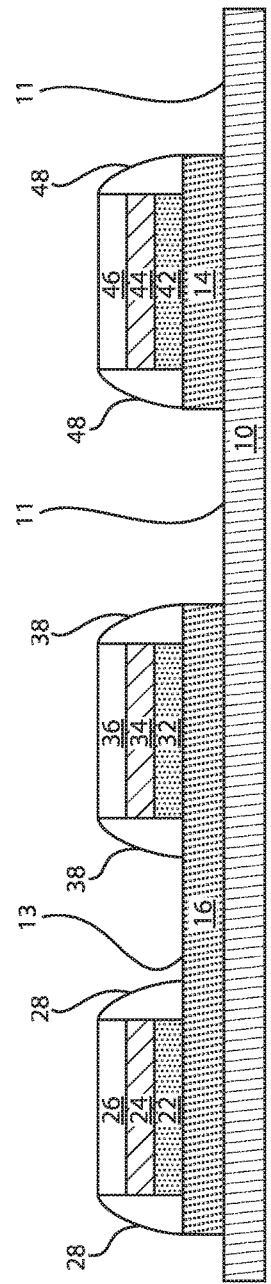

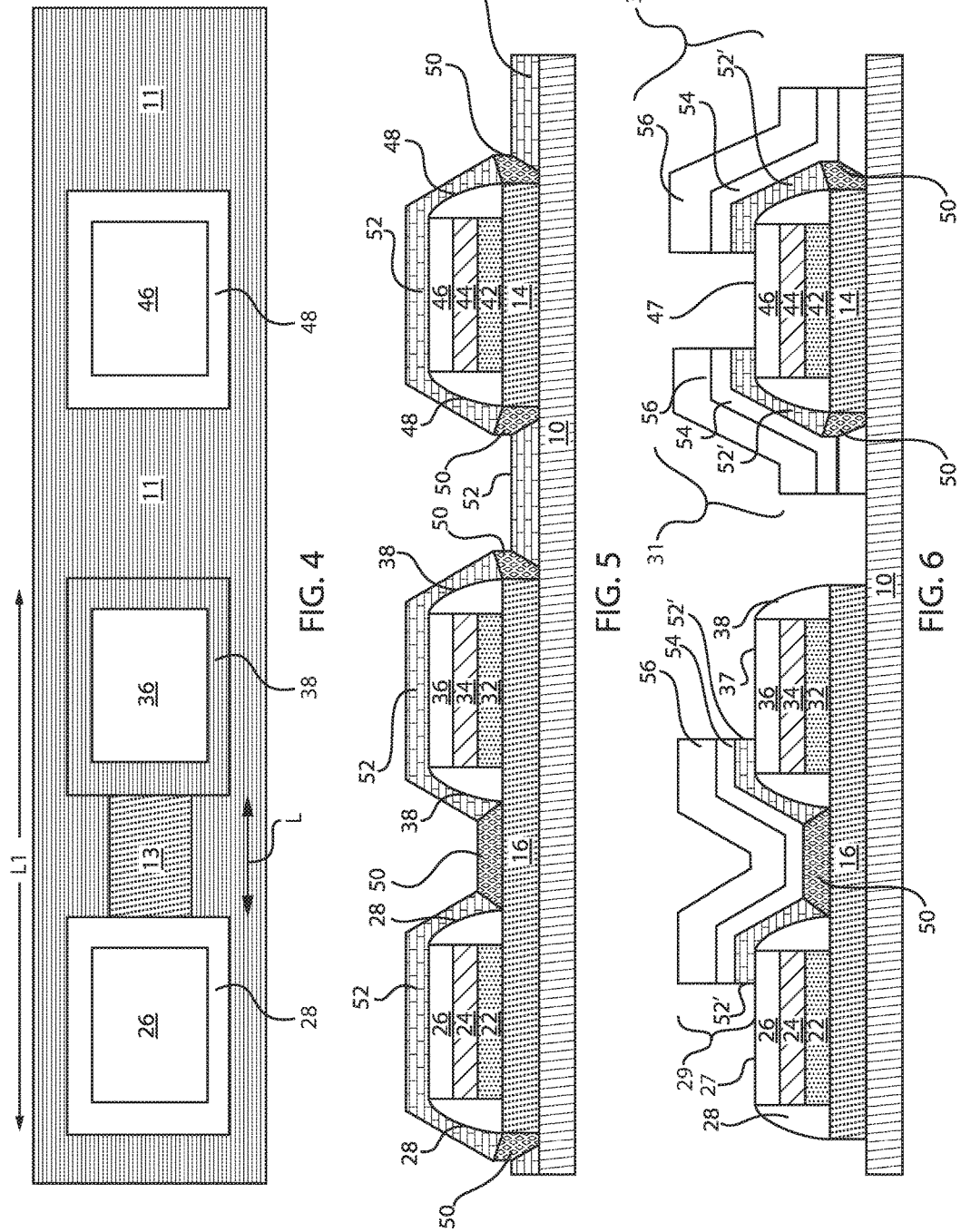

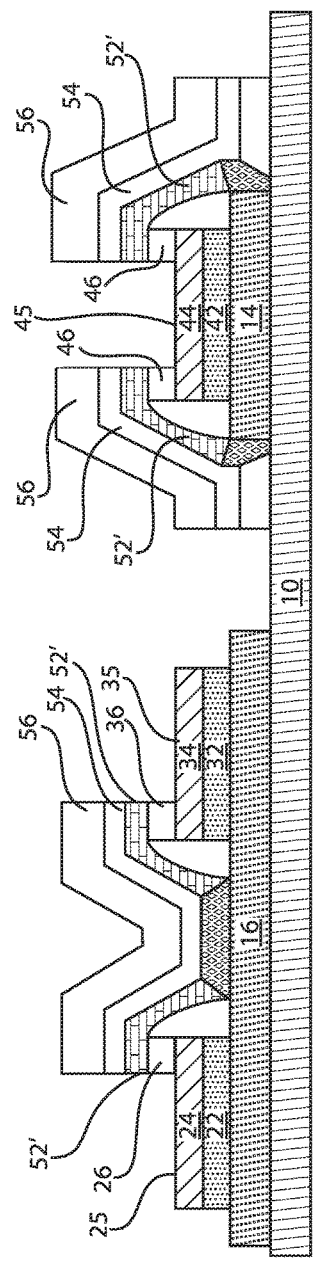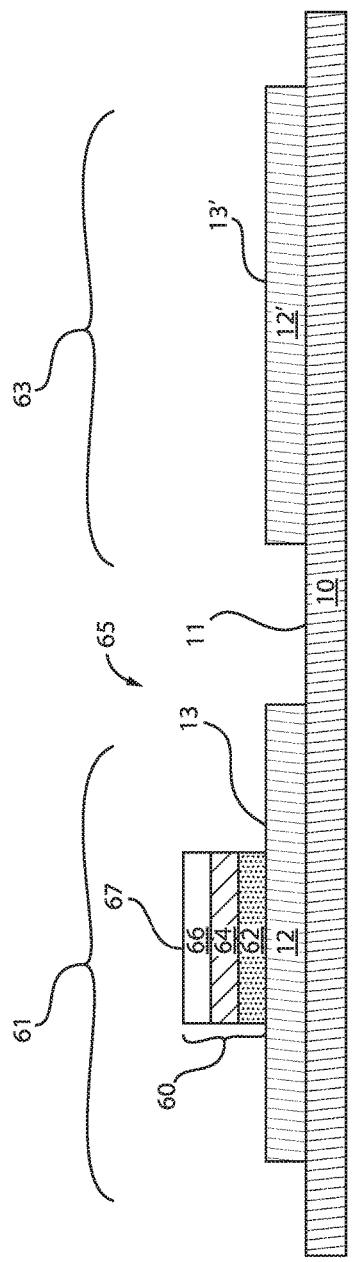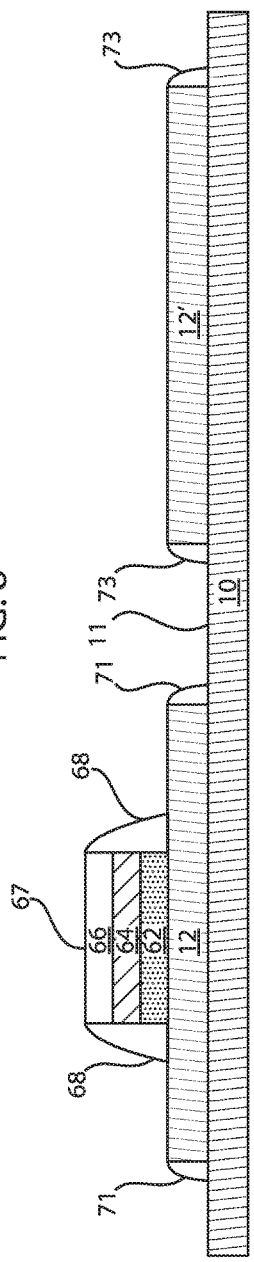

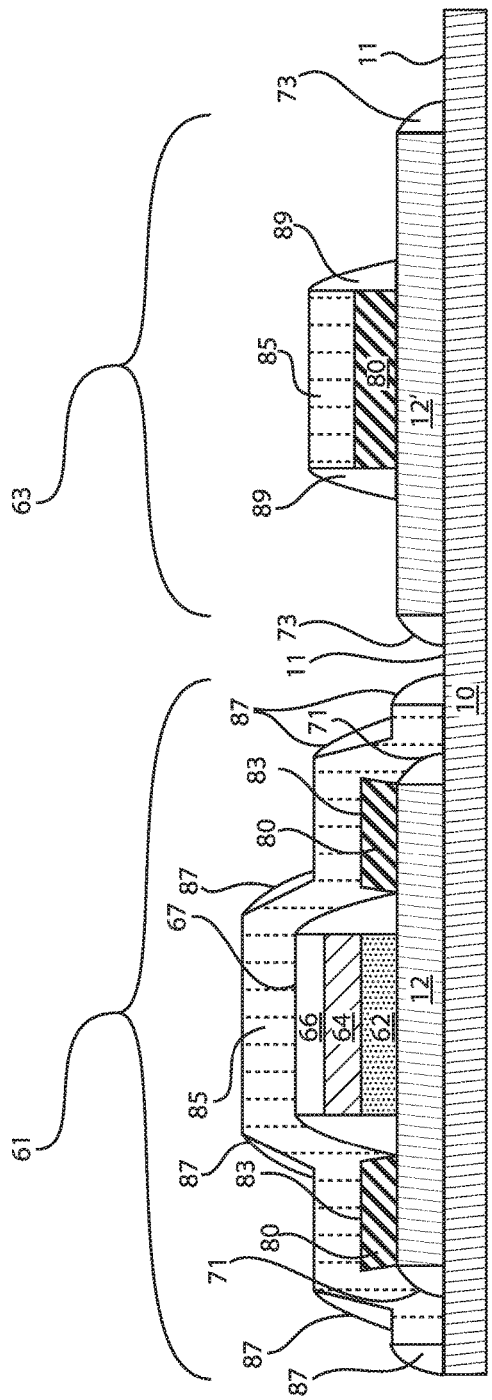
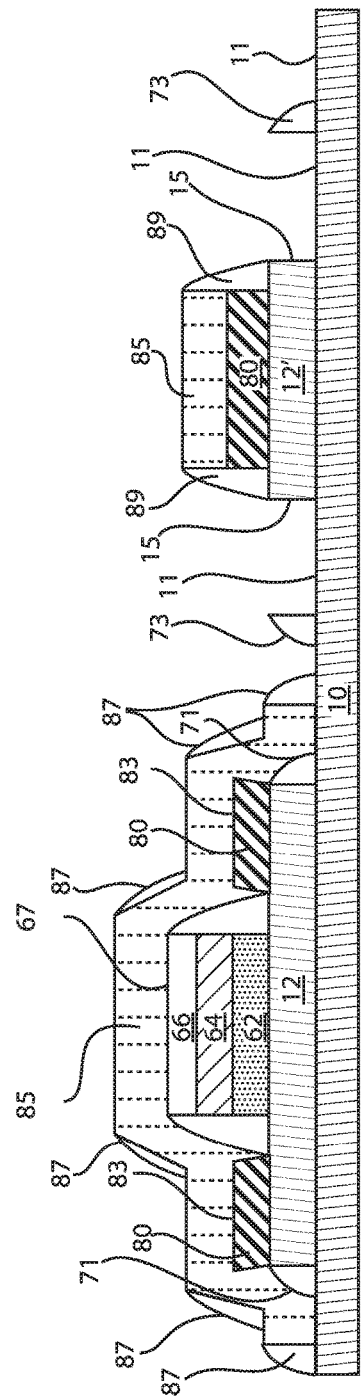
FIG. 14
FIG. 15

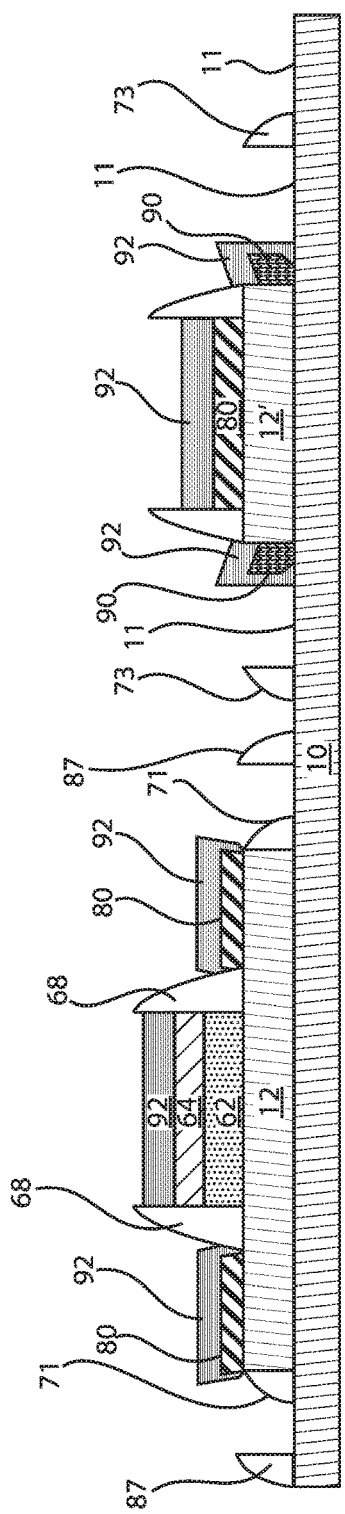
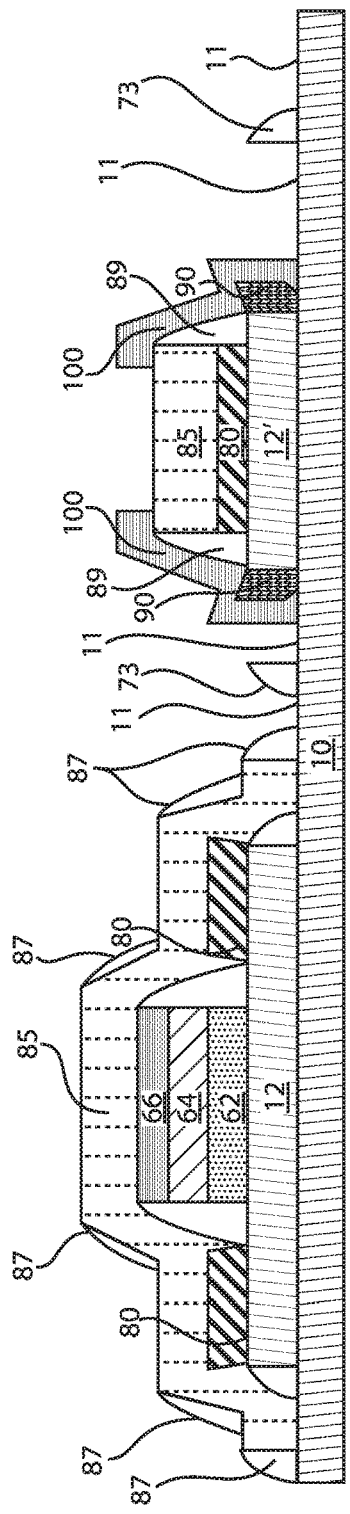

THIN-FILM NEGATIVE DIFFERENTIAL RESISTANCE AND NEURONAL CIRCUIT

BACKGROUND

Technical Field

The present invention relates generally to semiconductor devices, and more specifically, to a thin-film negative differential resistance and neuronal circuit.

Description of the Related Art

Neuromorphic and synaptronic systems, also referred to as artificial neural networks, are computational systems that permit electronic systems to essentially function in a manner analogous to that of biological brains. Neuromorphic and synaptronic systems do not generally utilize the traditional digital model of manipulating 0s and 1s. Instead, neuromorphic and synaptronic systems create connections between processing elements that are roughly functionally equivalent to neurons of a biological brain. Neuromorphic and synaptronic systems can include various electronic circuits that are modeled on biological neurons.

SUMMARY

In accordance with an embodiment, a method is provided for forming a semiconductor device. The method includes forming source and drain structures of a first device on a first portion of a semiconductor material located on a surface of an insulating substrate, each of the source and drain structures including a hydrogenated silicon layer, a conducting layer, and a sacrificial layer and forming a base structure of a second device on a second portion of the semiconductor material located on the surface of the insulating substrate, the base structure including a hydrogenated silicon layer, a conducting layer, and a sacrificial layer. The method further includes depositing hydrogenated silicon resulting in formation of crystalline hydrogenated silicon adjacent the semiconductor material and formation of first amorphous hydrogenated silicon over the sacrificial layer of the source and drain structures of the first device and over the base structure of the second device, depositing second amorphous hydrogenated silicon over the sacrificial layer of the source and drain structures of the first device and over the base structure of the second device, depositing and patterning the conducting layer over the second amorphous hydrogenated silicon, and etching the exposed second amorphous hydrogenated silicon and the first amorphous hydrogenated silicon to form a gate structure for the first device, and emitter and collector structures for the second device.

In accordance with an embodiment, a method is provided for forming a semiconductor device. The method includes forming a gate structure of a first device on a first portion of a semiconductor material located on a surface of an insulating substrate, the gate structure including a first hydrogenated silicon layer, a second hydrogenated silicon layer, and a first sacrificial layer, forming a second portion of the semiconductor material located on the surface of the insulating substrate to create a second device, depositing hydrogenated silicon resulting in formation of first crystalline hydrogenated silicon over the first and second portions of the semiconductor material and formation of first amorphous hydrogenated silicon at least over the dielectric layer of the gate structure of the first device, selectively removing the first amorphous hydrogenated silicon, forming a second sacrificial layer over the first device and over a region of the second portion of the semiconductor material of the second device, etching exposed sections of the second portion of the semiconductor material of the second device, depositing hydrogenated silicon resulting in formation of second crystalline hydrogenated silicon adjacent exposed sidewalls of the second portion of the semiconductor material of the second device and formation of second amorphous hydrogenated silicon in other areas, selectively removing the second amorphous hydrogenated silicon, and selectively forming silicide on the first and second devices.

In accordance with another embodiment, a monolithically integrated pair of semiconductor devices on an insulating substrate are provided. The semiconductor devices include a field-effect transistor including first hydrogenated silicon-based contacts formed on a first portion of a semiconductor material of an insulating substrate and a bipolar transistor including second hydrogenated silicon-based contacts formed on a second portion of the semiconductor material of the insulating substrate. At least a portion of source and drain contacts of the field-effect transistor and a base contact of the bipolar transistor include a same material and are formed simultaneously, and/or at least a portion of emitter and collector contacts of the bipolar transistor and a gate contact of the field-effect transistor include a same material and are formed simultaneously.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1 is a cross-sectional view of an insulating substrate having a semiconductor material located thereon for forming an integrated heterojunction field effect transistor (HJFET) and a heterojunction bipolar transistor (HBT), in accordance with an embodiment of the present disclosure;

FIG. 2 is a cross-sectional view of the structure of FIG. 1 where spacers are formed adjacent the HJFET and the HBT devices, in accordance with an embodiment of the present disclosure;

FIG. 3 is a cross-sectional view of the structure of FIG. 2 after defining the active regions, in accordance with an embodiment of the present disclosure;

FIG. 4 is a top view of the semiconductor device of FIG. 3, in accordance with an embodiment of the present disclosure;

FIG. 5 is a cross-sectional view of the semiconductor device of FIG. 3 where amorphous and crystalline hydrogenated silicon is formed over and/or adjacent the HJFET and the HBT devices by means of epitaxial deposition of hydrogenated Si, in accordance with an embodiment of the present disclosure;

FIG. 6 is a cross-sectional view of the semiconductor device of FIG. 5 where another amorphous hydrogenated silicon layer and a conducting layer are deposited and patterned to form a gate stack for the HJFET, and emitter and collector regions for the HBT, in accordance with an embodiment of the present disclosure;

FIG. 7 is a cross-sectional view of the semiconductor device of FIG. 6 where the dielectrics of the HJFET and the HBT are etched, in accordance with an embodiment of the present disclosure;

FIG. 8 is a cross-sectional view of an insulating substrate having semiconductor materials located thereon for forming a HJFET on a first semiconductor material and a bipolar junction transistor (BJT) on a second semiconductor material, in accordance with another embodiment of the present disclosure;

FIG. 9 is a cross-sectional view of the semiconductor device of FIG. 8 where spacers are formed adjacent the HJFET and the semiconductor materials, in accordance with an embodiment of the present disclosure;

FIG. 13' is a cross-sectional view of the semiconductor structure of FIG. 13 where an amorphous crystalline layer has been patterned using a dielectric layer as a mask, in accordance with an embodiment of the present disclosure;

FIG. 14 is a cross-sectional view of the semiconductor device of FIG. 12 where spacers are formed at least for the BJT device, in accordance with an embodiment of the present disclosure;

FIG. 15 is a cross-sectional view of the semiconductor device of FIG. 14 where the exposed second semiconductor material of the BJT is etched, in accordance with an embodiment of the present disclosure;

FIG. 18 is a cross-sectional view of the semiconductor device of FIG. 17 where silicide is selectively formed on portions of the HJFET and the BJT, in accordance with an embodiment of the present disclosure;

FIG. 19 is a cross-sectional view of the semiconductor device of FIG. 16 where a layer of amorphous hydrogenated silicon is deposited over the crystalline hydrogenated silicon grown adjacent the remaining second semiconductor material of the HBT, in accordance with another embodiment of the present disclosure;

Throughout the drawings, same or similar reference numerals represent the same or similar elements.

DETAILED DESCRIPTION

Figure 10:
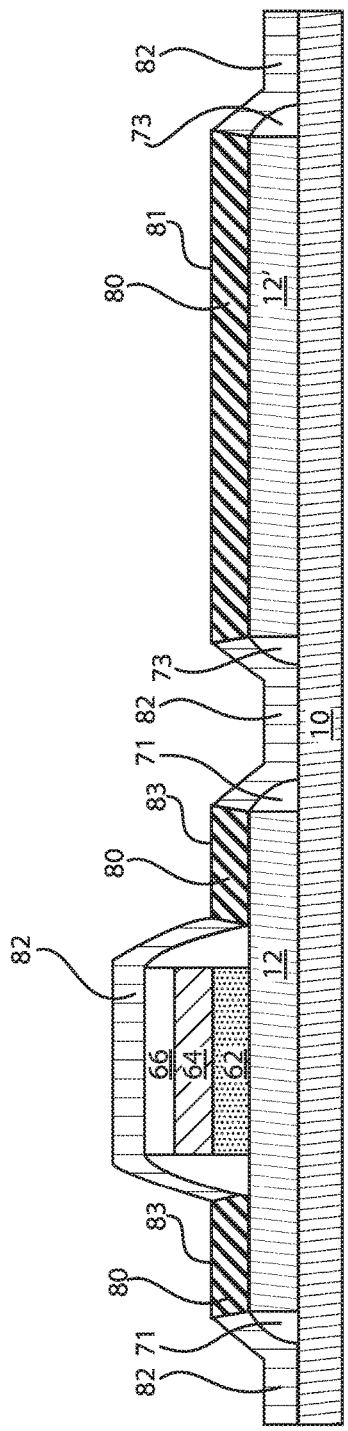
FIG. 10 is a cross-sectional view of the semiconductor device of FIG. 9 where amorphous and crystalline hydrogenated silicon is formed over and/or adjacent the HJFET device, in accordance with an embodiment of the present disclosure.

Embodiments in accordance with the present invention provide methods and devices for implementing neuronal circuits (or neural circuits) in large-area and flexible electronics. A neural circuit is a complete loop of neurons from a receptor through a nervous system ending at an effector. The flow of information in the nervous system is dictated by neuronal circuits. The direction of information flow in any particular circuit is essential to understanding its function.

Nerve cells that carry information toward the central nervous system (or farther centrally within the spinal cord and brain) are called afferent neurons and nerve cells that carry information away from the brain or spinal cord (or away from the circuit in question) are called efferent neurons. Nerve cells that only participate in local aspects of a circuit are called interneurons or local circuit neurons. These three classes (afferent neurons, efferent neurons, and interneurons) are the basic constituents of all neural circuits.

Embodiments in accordance with the present invention provide methods and devices for forming a neuronal circuit by integrating a heterojunction field effect transistor (HJFET) device and a heterojunction bipolar transistor (HBT) device. The integrated HJFET and HBT form a negative differential resistor (NDR) when configured as a "lambda" diode in a circuit. The lambda diode produces an "N-type" NDR. By leveraging the N-type NDR, a neuronal circuit producing an all-or-nothing firing response can be achieved. The NDR is applicable not only to neuronal circuits, but also to other applications of NDR, such as, but not limited to, amplifiers, voltage-controlled oscillators, bi-stable circuits, and other large-area circuit designs. It will be appreciated that in some embodiments, the emitter region of the bipolar transistor can include a semiconductor material having the same bandgap as that of the semiconductor substrate thus forming a homo-junction bipolar transistor (often simply referred to as a bipolar junction transistor or BJT) rather than a heterojunction bipolar transistor (HBT). Similarly, it will be appreciated that in some embodiments, the gate region of the field-effect transistor can include a semiconductor material having the same bandgap as that of the semiconductor substrate thus forming a homo-junction field-effect transistor (often simply referred to as a junction field-effect transistor or JFET) rather than a heterojunction field-effect transistor (HJFET).

Embodiments in accordance with the present invention provide methods and devices which are effective and technologically beneficial in producing an NDR with a lambda diode because (i) a lambda diode does not need a high HBT (or BJT) gain to produce an NDR effect. Therefore, low-temperature (laser-crystallized) poly-silicon with relatively lower minority carrier lifetime than mono-silicon can be used, and (ii) a HJFET (or JFET) and a HBT (or BJT) share a same substrate doping type (n or p-type), which is activated during laser crystallization and no further counter-doping and thermal activation (not feasible on low-cost and/or flexible substrates) is needed.

Embodiments in accordance with the present invention provide methods and devices for forming an NDR including a HJFET and a HBT where the HJFET and the HBT have hydrogenated silicon-based contacts on a thin-film crystalline silicon-based substrate. A neuronal circuit can include the NDR, a bias resistor, a resistor-capacitor (RC) delay circuit, and a resetting transistor connected between the RC delay unit and an input of the neuronal circuit. The RC delay unit and the resetting transistor are implemented by the HJFET and the HBT. The HJFET and the HBT can include thin-film silicon-based substrates having same doping type and concentration.

It is to be understood that the present invention will be described in terms of a given illustrative architecture; however, other architectures, structures, substrate materials and process features and steps/blocks may be varied within the scope of the present invention. It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a cross-sectional view of an insulating substrate having a semiconductor material located thereon for forming an integrated heterojunction field effect transistor (HJFET) and a heterojunction bipolar transistor (HBT), in accordance with an embodiment of the present disclosure is presented.

In one example, a semiconductor material 12 can be positioned directly over an insulating substrate or buried insulator 10. The semiconductor material 12 has a top surface 13. The semiconductor material 12 can be a single-crystalline or a poly-crystalline silicon (Si) substrate. One example of interest is a low-temperature poly-silicon (LTPS) prepared by laser crystallization of amorphous Si. The insulating handle substrate 10 can include glass, plastic or dielectric-coated metal foil.

The structure 5 includes a HJFET structure 7 and a HBT structure 9.

The HJFET 7 is formed on the left hand side of the top surface 13 of the semiconductor material 12. The HJFET 7 includes a source contact 20 and a drain contact 30. The source contact 20 includes, e.g., three layers, that is, a hydrogenated silicon (Si:H) layer 22, a conducting layer 24 (or metal layer 24), and a dielectric layer 26. Similarly, the drain contact 30 includes, e.g., three layers, that is, a hydrogenated silicon (Si:H) layer 32, a conducting layer 34 (or metal layer 34), and a dielectric layer 36. The hydrogenated silicon layers 22, 32 have the same doping type as that of the semiconductor material 12. Typically, the hydrogenated silicon layers 22, 32 are highly doped. In one example, the semiconductor material 12 has p-type doping and the hydrogenated silicon layers 22, 32 are p$^+$ doped.

The HBT 9 is formed on the right hand side of the top surface 13 of the semiconductor material 12. The HBT 9 includes a base contact 40. The base contact 40 includes e.g., three layers, that is, a hydrogenated silicon (Si:H) layer 42, a conducting layer 44 (or metal layer 44), and a dielectric layer 46. The hydrogenated silicon layer 42 has the same doping type as that of the semiconductor material 12. Typically, the hydrogenated silicon layer 42 is highly doped. In one example, the semiconductor material 12 has p-type doping and the hydrogenated silicon layer 42 is p$^+$ doped.

The dielectric layers 26, 36, 46 can be sacrificial layers. The dielectric layers 26, 36, 46 can have a very high etch rate.

The p$^+$ doped hydrogenated Si containing layers 22, 32, 42 can include p$^+$ hydrogenated crystalline Si (p$^+$ c-Si:H). Typically, p$^+$ c-Si:H is grown epitaxially, therefore it is single-crystalline when the semiconductor substrate 10 is single-crystalline, and poly-crystalline when the semiconductor substrate 10 is poly-crystalline. However, it can also include p$^+$ hydrogenated micro-crystalline Si (p$^+$ µc-Si:H) which is not grown epitaxially. It can also include other elements such as Ge, C, F, N, D, Cl, etc. In one example, p$^+$ Si:H is etched selectively against the p-type Si substrate using a dilute potassium hydroxide (KOH) solution.

In preferred embodiments, the source contact 20, the drain contact 30, and the base contact 40 include the same material stack deposited and/or grown simultaneously, and defined using the same photolithography (masking) step. Therefore, the structure of FIG. 1 can be formed by a hydrogenated Si deposition step, conductive material deposition step, dielectric deposition step, and a photolithography (masking) step, followed by sequential etching of the dielectric, conductive material, and hydrogenated Si. Typically, the HJFET and the HBT devices are symmetric, e.g., the source of the HJFET has the same geometry and composition as that of the drain of the HJFET, and the emitter of the HBT has the same geometry and composition as that of the collector of the HBT.

FIG. 2 is a cross-sectional view of the structure of FIG. 1 where spacers are formed adjacent the HJFET and the HBT devices, in accordance with an embodiment of the present disclosure.

In various embodiments, spacers 28 are formed adjacent the source contact 20 and spacers 38 are formed adjacent the drain contact 30 of the HJFET 7. Additionally, spacers 48 are formed adjacent the gate contact 40 of the HBT 9.

The spacer material is chosen to have a much lower etch rate in a wet chemical solution, such as buffer hydrogen fluoride (HF), than the sacrificial top dielectric layers 26, 36, 46 used in the HJFET and HBT stacks 20, 30, 40, respectively. In one example, the spacer material includes a high-k dielectric formed by atomic layer deposition, whereas the sacrificial dielectrics 26, 36, 46 include high-OH oxide deposited by plasma-enhanced chemical vapor deposition (PECVD) at low plasma power density.

FIG. 3 is a cross-sectional view of the structure of FIG. 2 after defining the active regions (i.e., device isolation). A portion of the semiconductor material is etched to expose a top surface of the insulating substrate adjacent the HBT, in accordance with an embodiment of the present disclosure.

FIG. 4 is a top view of the structure of FIG. 3, in accordance with an embodiment of the present disclosure. Active regions are defined using a mask including patterns having lengths $L_{mask}$ where $L<L_{mask}<L1$ (therefore portion 13 of semiconductor material 12 is masked by photoresist after photolithography) and an etch chemistry selective to dielectrics such that the portions of semiconductor material 12 covered by dielectric and/or spacers are also masked and therefore not etched in the etch chemistry. In one example where the semiconductor material 12 is comprised of Si, tetramethylammonium hydroxide (TMAH) wet-etch or other conventional dry-etch chemistries such as $SF_6/O_2$ or $CF_4$ are used.

FIG. 5 is a cross-sectional view of the semiconductor device of FIG. 3 where amorphous and crystalline hydrogenated silicon is formed over and/or adjacent the HJFET and the HBT devices by means of epitaxial deposition of hydrogenated Si, in accordance with an embodiment of the present disclosure. Epitaxial deposition of hydrogenated Si (Si:H) results in growth of hydrogenated crystalline Si (c-Si:H) on the exposed surfaces of the semiconductor layer 12 (regions 16 and 14) and in growth of hydrogenated amorphous Si (a-Si:H) elsewhere, i.e., on dielectric surfaces. If the semiconductor layer 12 is mono-crystalline, the c-Si:H layer can be mono-crystalline or poly-crystalline. If the semiconductor layer 12 is poly-crystalline, the c-Si:H layer is also poly-crystalline.

In various embodiments, hydrogenated silicon (Si:H) can be grown by PECVD from a mixture of precursor gas silane ($SiH_4$) (or other gases of the $Si_xH_y$ family), carrier gas $H_2$ and dopant gas, such that $[H_2]/[SiH_4]>5$. A crystalline hydrogenated silicon layer 80 and an amorphous hydrogenated silicon layer 82 can be grown depending on whether the underlying material is crystalline or amorphous. In one example, the crystalline and the amorphous hydrogenated silicon layers 50, 52 are highly doped. In one example where the semiconductor regions 16 and 11 are p-type, the c-Si:H and a-Si:H regions are $n^+$ doped.

In some embodiments, hot-wire chemical vapor deposition (HWCVD) can be used instead of PECVD. For n-type doping, the dopant gas can include phosphine ($PH_3$). For p-type doping, the dopant gas can include diborane ($B_2H_6$) or tetramethylbenzidine (TMB). The c-Si:H has hydrogen (H) content in the range of, e.g., 5-40 atomic percent. The H content in c-Si:H may or may not be uniform. In some embodiments, the H content can have a gradient towards the interface between c-Si:H and the semiconductor material (e.g., LTPS) forming regions 16 and 14.

In some embodiments, the Si:H can further include one or more of the following elements: D, F, Cl, C, Ge, O, N.

FIG. 6 is a cross-sectional view of the semiconductor device of FIG. 5 where another amorphous hydrogenated silicon layer 54 and a conducting layer 56 are deposited and patterned to form a gate stack for the HJFET and emitter and/or collector regions for the HBT, in accordance with an embodiment of the present disclosure. As a result, a top surface 27 of the source contact 20 of the HJFET 7, a top surface 37 of the drain contact 30 of the HJFET 7, and a top surface 47 of the base contact 40 of the HBT 9 are exposed.

The layer 54 contacts both the hydrogenated crystalline silicon 50 and the hydrogenated amorphous silicon 52' formed between the source and drain contacts 20, 30 of the HJFET 7. Moreover, the layer 54 contacts both the hydrogenated crystalline silicon 50 and the hydrogenated amorphous silicon 52' formed around the gate contact 40 of the HBT 9.

The second $n^+$ Si:H layer 54 is deposited (preferably in the same chamber without breaking the vacuum) using conditions that do not result in epitaxial growth (typically $[H_2]/[SiH_4]<5$) therefore resulting in $n^+$ a-Si:H growth everywhere. The metal layer 56 is then deposited. Finally, the metal layer 56, the second $n^+$ Si:H layer ($n^+$ a-Si:H) 54, and the first $n^+$ Si:H layer 52' are patterned using the same mask. This forms the gate stack 29 of the HJFET 7, and emitter and collector stacks 31, 33 of the HBT 9. Thus, the HJFET 7 is now complete as it includes a source structure 20, a drain structure 30, and a gate structure 29. Similarly, the HBT 9 is now complete as it includes the emitter structure 31, the collector structure 33, and the base structure 40.

FIG. 7 is a cross-sectional view of the semiconductor device of FIG. 6 where the dielectrics of the HJFET and the HBT are etched, in accordance with an embodiment of the present disclosure.

The dielectrics of the HJFET 7 and the HBT 9 are etched to expose a top surface 25 of the metal layer 24 of the source contact 20 of the HJFET 7, a top surface 35 of the metal layer 34 of the drain contact 30 of the HJFET 7, and a top surface 45 of the metal layer 44 of the base contact 40 of the HBT 9.

The semiconductor material of particular interest for layer 12 is LTPS, but the process is applicable to other forms of poly-Si, mono-Si, or other semiconductors, such as mono/poly germanium (Ge), silicon germanium (SiGe), III-V materials, etc.

c-Si:H can be grown by PECVD from a mixture of precursor gas silane ($SiH_4$) (or other gases of the $Si_xH_y$ family), carrier gas $H_2$ and dopant gas, such that $[H_2]/[SiH_4]>5$. In some embodiments, hot-wire chemical vapor deposition (HWCVD) can be used instead of plasma-enhanced chemical vapor deposition (PECVD). The dopant gas can include $PH_3$ for n-type doping, and $B_2H_6$ or TMB for p-type doping.

The c-Si:H has H content in the range of 5-40 atomic percent. The H content in c-Si:H may or may not be uniform. In some embodiments, the H content has a gradient towards the c-Si:H/LTPS interface. Growth temperature is in the range of room-temperature to about 450° C., with about 150-250° C. being more preferred.

FIG. 8 is a cross-sectional view of an insulating substrate having semiconductor materials located thereon for forming a HJFET on a first semiconductor material and a bipolar junction transistor (BJT) on a second semiconductor material, in accordance with another embodiment of the present disclosure.

In one example, a semiconductor material 12 can be positioned directly over an insulating substrate or buried insulator 10. The insulating substrate 10 has a top surface 11. The semiconductor material 12 can be split or divided into two portions or sections, e.g., a first semiconductor material section 12' and a second semiconductor material section 12.

The structure 65 includes a HJFET portion 61 and a BJT portion 63.

The HJFET 61 is formed on the left hand side of the top surface 13 of the semiconductor material section 12. The HJFET 61 includes a gate contact 60. The gate contact 60 includes, e.g., three layers, that is, a first amorphous hydrogenated silicon (a-Si:H) layer 62, a second amorphous hydrogenated silicon (a-Si:H) layer 64, and a dielectric layer 66. The dielectric layer 66 can be a sacrificial layer. The dielectric layer includes a top surface 67. The hydrogenated silicon layers 62, 64 can be doped layers. The hydrogenated silicon layers 62, 64 form a p-n or p-i-n heterojunction with the semiconductor material 12. In one example, the semiconductor layer 12 can include an n-type dopant, the hydrogenated silicon layer 62 can be an intrinsic layer and the hydrogenated silicon layer 64 can include a p-type dopant.

The BJT 63 is subsequently formed on the right hand side of the top surface 13' of the semiconductor material 12'.

FIG. 9 is a cross-sectional view of the semiconductor device of FIG. 8 where spacers are formed adjacent the HJFET and the semiconductor materials, in accordance with an embodiment of the present disclosure.

In various embodiments, spacers 68 are formed adjacent the gate contact 60 of the HJFET 61 and spacers 71 are formed adjacent the semiconductor material 12 of the HJFET 61. Additionally, spacers 73 are formed adjacent the semiconductor material 12' of the BJT 63.

FIG. 10 is a cross-sectional view of the semiconductor device of FIG. 9 where amorphous and crystalline hydrogenated silicon is formed over and/or adjacent the HJFET device by means of epitaxial deposition of hydrogenated Si, in accordance with an embodiment of the present disclosure. Epitaxial deposition of hydrogenated Si (Si:H) results in the growth of hydrogenated crystalline Si (c-Si:H) on the exposed surfaces of the semiconductor regions 12 and 12', and in the growth of hydrogenated amorphous Si (a-Si:H) elsewhere, e.g., on dielectric surfaces. If the semiconductor regions 12 and 12' are mono-crystalline, the c-Si:H layer can be mono-crystalline or poly-crystalline. If the semiconductor regions 12 and 12' are poly-crystalline, the c-Si:H layer is also poly-crystalline.

In various embodiments, hydrogenated silicon (Si:H) can be grown by PECVD from a mixture of precursor gas $SiH_4$ (or other gases of the $Si_xH_y$ family), carrier gas $H_2$ and dopant gas, such that $[H_2]/[SiH_4]>5$. A crystalline hydrogenated silicon layer 80 and an amorphous hydrogenated silicon layer 82 can be grown depending on whether the underlying material is crystalline or amorphous. In one example, the crystalline and the amorphous hydrogenated silicon layers 80, 82 are highly doped. In one example where the semiconductor regions 12 and 12' are n-type, the c-Si:H and a-Si:H regions 80 and 82 are $n^+$ doped.

Figure 11:
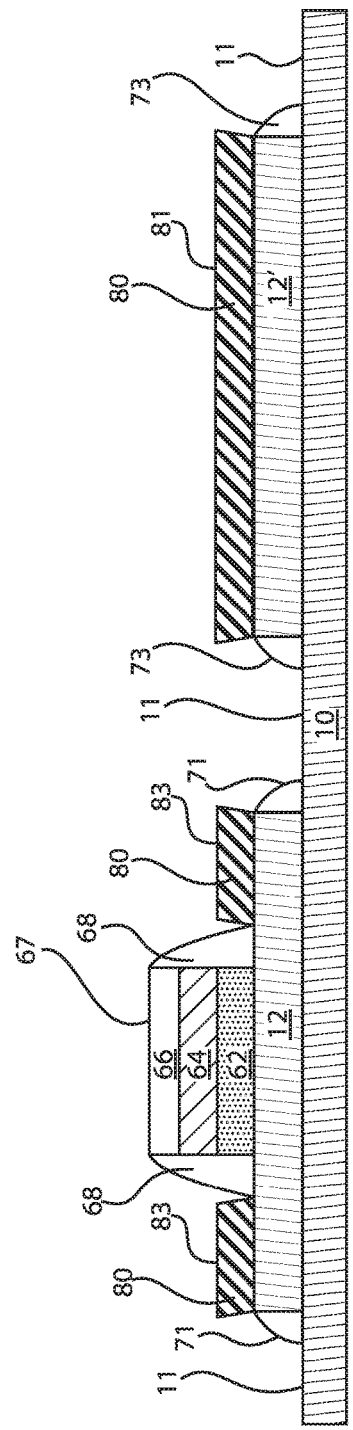
FIG. 11 is a cross-sectional view of the semiconductor device of FIG. 10 where the amorphous hydrogenated silicon is selectively removed to leave behind the crystalline hydrogenated silicon, in accordance with an embodiment of the present disclosure.

FIG. 11 is a cross-sectional view of the semiconductor device of FIG. 10 where the amorphous hydrogenated silicon is selectively removed to leave behind the crystalline hydrogenated silicon, in accordance with an embodiment of the present disclosure.

In various embodiments, after hydrogenated silicon (Si:H) is grown and selective etching is performed of the $n^+$ hydrogenated amorphous silicon layer 82 (a-Si:H), $n^+$ hydrogenated crystalline silicon (c-Si:H) 80 is left behind. The etching exposes a top surface 67 of the gate contact 60 of the HJFET 61. Additionally, the top surface 11 of the insulating substrate 10 is exposed, as well as the spacers 71 formed adjacent the semiconductor material 12 and spacers 73 formed adjacent the semiconductor material 12'. Additionally, the spacers 68 formed adjacent the gate contact 60 are exposed.

In one embodiment, selective etch is performed in-situ using hydrogen (H) plasma. In another embodiment a wet etch such as dilute KOH (~1M or below) or dilute HF (<5% is deionized (DI) water) is used. In one embodiment, the a-Si:H is etched selectively with respect to c-Si:H with selectively in the range of 3:1-10:1. In another embodiment selectivity is greater than 10:1.

Figure 12:
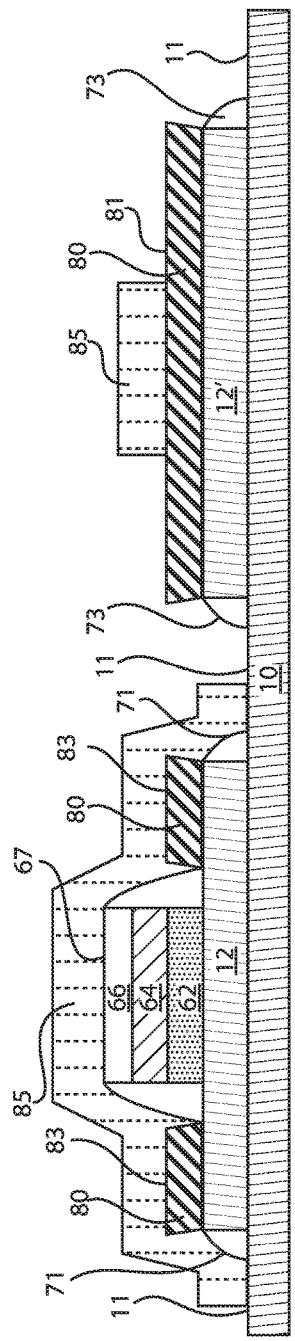
FIG. 12 is a cross-sectional view of the semiconductor device of FIG. 11 where a dielectric layer is deposited and patterned, in accordance with an embodiment of the present disclosure.

FIG. 12 is a cross-sectional view of the semiconductor device of FIG. 11 where a dielectric layer is deposited and patterned, in accordance with an embodiment of the present disclosure.

In various embodiments, a dielectric layer 85 is disposed over the entire HJFET 61 (to fully cover the HJFET 61) and over a portion of the BJT 63 which will subsequently define the base region of the BJT 63.

The materials used for the first and second sacrificial dielectric layers are chosen to have a much higher etch rate in a wet chemical solution such as buffered HF (or a dry etch) than the dielectric material used for the spacers. In one example, the spacer material includes a high-k dielectric formed by atomic layer deposition whereas the sacrificial dielectrics include high-OH oxide deposited by PECVD at low plasma power.

Figure 13:
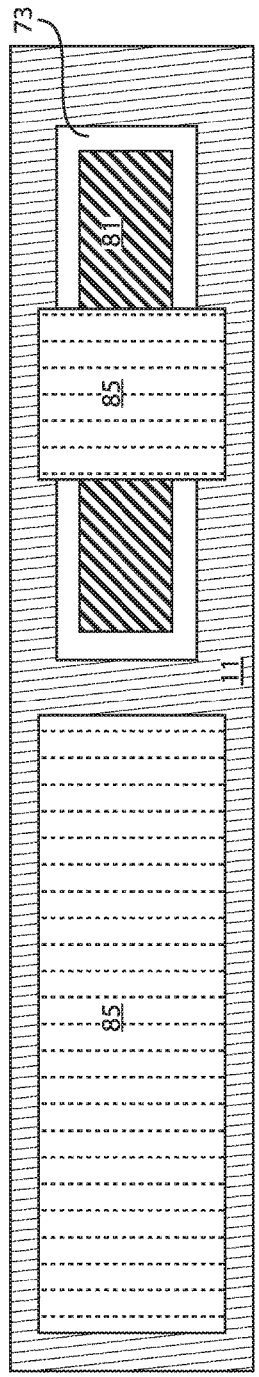
FIG. 13 is a top view of the semiconductor device of FIG. 12, in accordance with an embodiment of the present disclosure.
Figure 13:
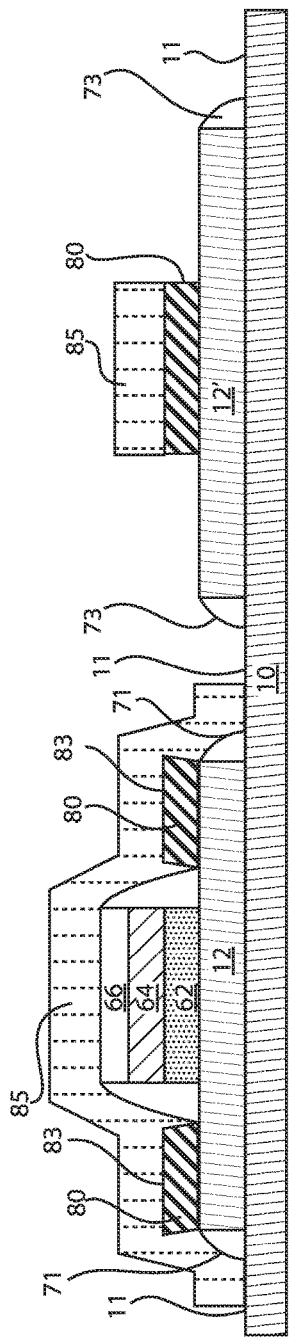

FIG. 13 is a top view of the semiconductor device of FIG. 12, in accordance with an embodiment of the present disclosure. The width of the dielectric region 85 is chosen larger than the width of the semiconductor region 12'. This ensures that subsequent epitaxial growth of c-Si:H for emitter and collection formation does not shunt the emitter and collector of the bipolar transistor as a result of c-Si:H growth on the sidewall of region 12' between the collector and the emitter.

FIG. 13' is a cross-sectional view of the semiconductor structure of FIG. 13 where $n^+$ c-Si:H layer 80 has been patterned using the dielectric layer 85 as a mask. In one example, a selective wet etch such as dilute (~1 M or below) KOH solution is used. In another example, a dry etch such as $CCl_2F_2/O_2$ is used.

FIG. 14 is a cross-sectional view of the semiconductor device of FIG. 13' where spacers are formed at least for the BJT device, in accordance with an embodiment of the present disclosure.

In various embodiments, spacers 87 are formed adjacent the dielectric 85 of the HJFET 61. Additionally, spacers 89 are formed adjacent the dielectric 85 of the BJT 63.

FIG. 15 is a cross-sectional view of the semiconductor device of FIG. 14 where the exposed second semiconductor material of the BJT is etched, in accordance with an embodiment of the present disclosure.

In various embodiments, the second semiconductor material 12' is etched to expose a top surface 11 of the insulating substrate 10. The etching also results in the exposure of sidewalls 15 of the remaining second semiconductor material 12'. The spacers 73 remain intact after the etching, in some embodiments.

The n-type Si substrate 12' is etched using an etch chemistry which is selective to dielectrics such that the Si regions covered by dielectric and/or spacers are not etched. For example tetra-methyl-ammonium-hydroxide (TMAH) can be used as a wet-etch. Various conventional dry-etch chemistries can be used as well. For example, tetrafluoromethane ($CF_4$) plasma, or (sulfur hexafluoride/oxygen gas) $SF_6/O_2$ plasma, etc.

Figure 16:
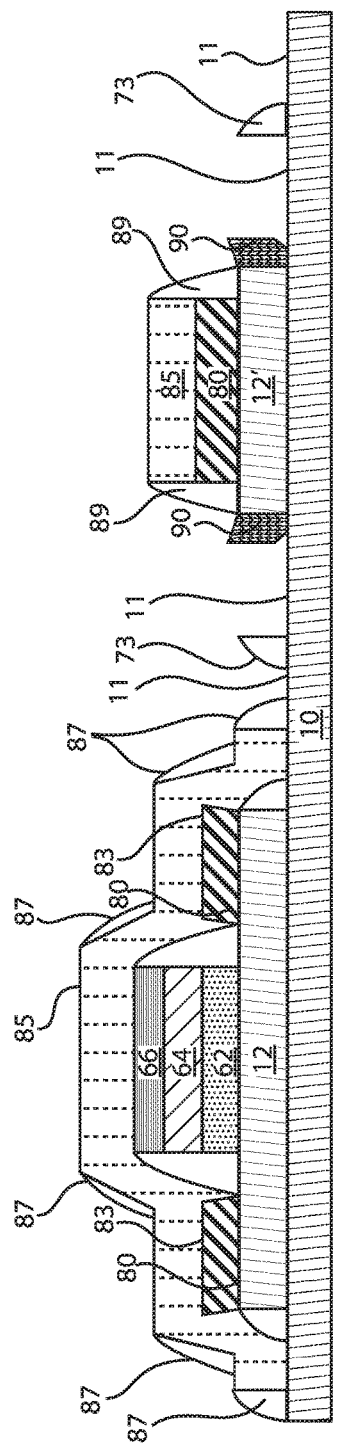
FIG. 16 is a cross-sectional view of the semiconductor device of FIG. 15 where crystalline hydrogenated silicon is grown adjacent the remaining second semiconductor material of the BJT, in accordance with an embodiment of the present disclosure.

FIG. 16 is a cross-sectional view of the semiconductor device of FIG. 15 where crystalline hydrogenated silicon is grown adjacent the remaining second semiconductor material of the BJT, in accordance with an embodiment of the present disclosure.

In various embodiments, crystalline hydrogenated silicon regions 90 are formed adjacent and in contact with the sidewalls 15 of the remaining second semiconductor material 12' of the BJT structure 63. The crystalline hydrogenated silicon regions 90 are formed by epitaxial deposition of hydrogenated Si (Si:H) followed by selective etching of hydrogenated amorphous silicon (a-Si:H) against hydrogenated crystalline silicon (c-Si:H). The epitaxial deposition of hydrogenated Si (Si:H) results in the growth of c-Si:H on the exposed sidewalls of the semiconductor region 12', and in the growth of a-Si:H elsewhere, e.g., on dielectric surfaces. The a-Si:H portion is then removed selectively, e.g. in situ, using a hydrogen plasma, leaving behind the c-Si:H regions 90. In one example, the c-Si:H regions 90 are highly doped. In one example where the semiconductor regions 12 and 12' are n-type, the c-Si:H regions 90 are $p^+$ doped.

Figure 17:
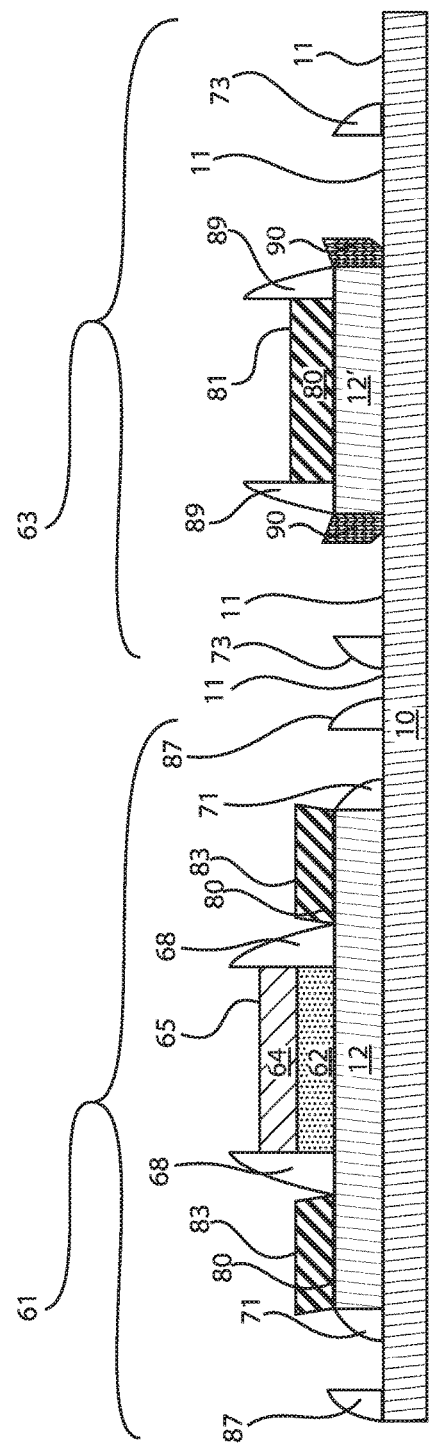
FIG. 17 is a cross-sectional view of the semiconductor device of FIG. 16 where the dielectric layers of the HJFET and the BJT are removed, in accordance with an embodiment of the present disclosure.

FIG. 17 is a cross-sectional view of the semiconductor device of FIG. 16 where the dielectric layers of the HJFET and the BJT are removed, in accordance with an embodiment of the present disclosure.

In various embodiments, the dielectrics 85 of the HJFET 61 (and the dielectric 66 of the HJFET 61) and the BJT 63 are etched to expose a top surface 65 of the layer 64 of the gate contact 60 of the HJFET 61 and a top surface 81 of the layer 80 of the BJT 63. Additionally, the crystalline hydrogenated silicon layers 80 of the HJFET 61 and the BJT 63 are exposed. In particular, the top surface 83 of the crystalline hydrogenated silicon layers 80 of the HJFET 61 and the top surface 81 of the crystalline hydrogenated silicon layers 80 of the BJT 63.

The sacrificial dielectric layers 85 can be removed by an HF solution. Dry etch e.g., $CF_4/O_2$ plasma can be used as well. The etch-time is kept to a minimum to avoid substantial etching of the spacers, which were chosen to have a much lower etch rate than the sacrificial dielectrics 66, 85.

FIG. 18 is a cross-sectional view of the semiconductor device of FIG. 17 where silicide is selectively formed on portions of the HJFET and the BJT, in accordance with an embodiment of the present disclosure.

In various embodiments, silicide 92 is selectively formed over the HJFET 61 and the BJT 63. The layer 64 can be consumed partially during the silicide formation process, as illustrated in the embodiment of FIG. 18, or can be entirely consumed in other embodiments. The HJFET 61 has, e.g., three layers of silicide 92. The first silicide layer 92 is formed over the $n^+$ c-Si:H layer 80 (left hand side), second silicide layer 92 is formed on the layer 64 and the third silicide layer 92 is formed on the $n^+$ c-Si:H layer 80 (right hand side). Similarly, the layer 80 can be consumed partially during the silicide formation process, as illustrated in the embodiment of FIG. 18, or can be entirely consumed in other embodiments.

The BJT 63 also has, e.g., three layers of silicide 92. The first and third silicide layers 92 are formed adjacent or surrounding or covering the $n^+$ c-Si:H regions 90, and the second silicide layer 92 is formed over the n-type c-Si:H layer 80.

Silicide contacts can be formed by (i) blanket deposition of metal, (ii) reaction between metal and Si:H to form silicide, (iii) selective removal of metal from areas other than Si:H (and the unreacted portion of metal on Si:H, in some embodiments), e.g., by using wet etching.

In some embodiments, silicide can form automatically during deposition of the metal. In such embodiments, the silicide formation can be assisted by raising the substrate temperature above the room temperature. In one example, the substrate temperature is about 150° C.

In some embodiments, silicide is formed after the metal deposition by annealing at moderate temperatures. In such embodiments, the annealing time and temperature are kept low enough to avoid out-diffusion of hydrogen from c-Si:H and therefore formation of defects that would compromise active doping.

In one example, annealing is performed at about 150° C. for about ½ hour. In another example, annealing is performed at about 200° C. for about 1 minute. In yet another example, annealing is performed at about 300° C. for about 10 seconds.

In some embodiments, selective removal of metal is facilitated by the poor adhesion of metal to dielectric surfaces whereas adhesion of silicide to Si:H is good.

FIG. 19 is a cross-sectional view of the semiconductor device of FIG. 16 where a layer of amorphous hydrogenated silicon is deposited and patterned over the crystalline hydrogenated silicon formed adjacent the remaining second semiconductor material of the BJT, in accordance with another embodiment of the present disclosure.

In various embodiments, after crystalline hydrogenated silicon regions 90 are formed adjacent and in contact with the sidewalls 15 of the remaining second semiconductor material 12', an amorphous hydrogenated silicon layer 100 is grown and patterned (e.g., using photolithography) to surround or cover the crystalline hydrogenated silicon regions 90 of the BJT 63. The amorphous hydrogenated silicon layer 100 can extend over the spacers 89 and onto a top surface of the dielectric 85 of the BJT 63. In one example, where the remaining second semiconductor material 12' is n-type, the crystalline hydrogenated silicon layer 90 and the amorphous hydrogenated silicon layer 100 are both $p^+$ doped. In some embodiments, the wider bandgap of the amorphous hydrogenated silicon layer 100 compared to that of crystalline hydrogenated silicon layer 90 increases the bipolar transistor gain. In such embodiments, given the larger bandgap of the hydrogenated amorphous Si material compared to that of the hydrogenated crystalline Si material, the bipolar transistor is a heterojunction bipolar transistor (HJFET) rather than a homojunction bipolar transistor.

Figure 20:
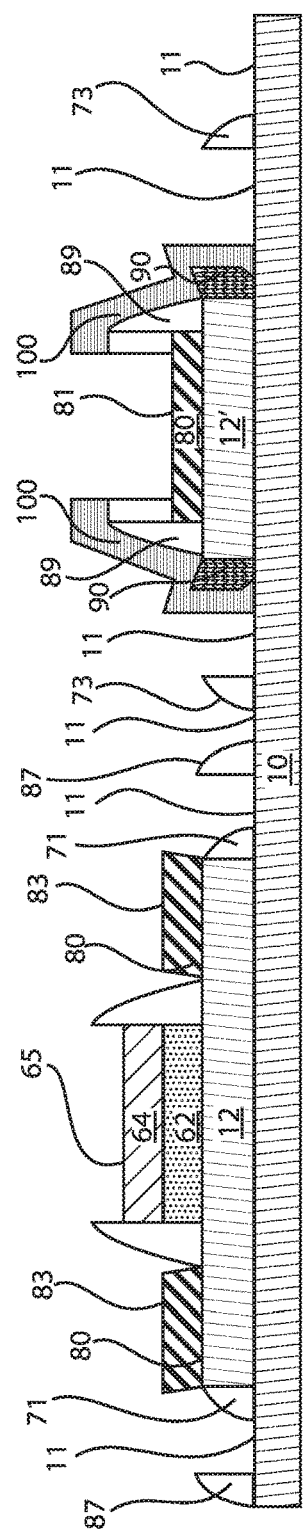
FIG. 20 is a cross-sectional view of the semiconductor device of FIG. 19 where the dielectric layers of the HJFET and the HBT are removed, in accordance with an embodiment of the present disclosure.

FIG. 20 is a cross-sectional view of the semiconductor device of FIG. 19 where the dielectric layers of the HJFET and the BJT are removed, in accordance with an embodiment of the present disclosure.

In various embodiments, the dielectrics 85 of the HJFET 61 (and the dielectric 66 of the HJFET 61) and the BJT 63 are etched to expose a top surface 65 of the layer 64 of the gate contact 60 of the HJFET 61 and a top surface 81 of the layer 80 of the BJT 63. Additionally, the crystalline hydrogenated silicon regions 82 of the HJFET 61 and the BJT 63 are exposed.

Figure 21:
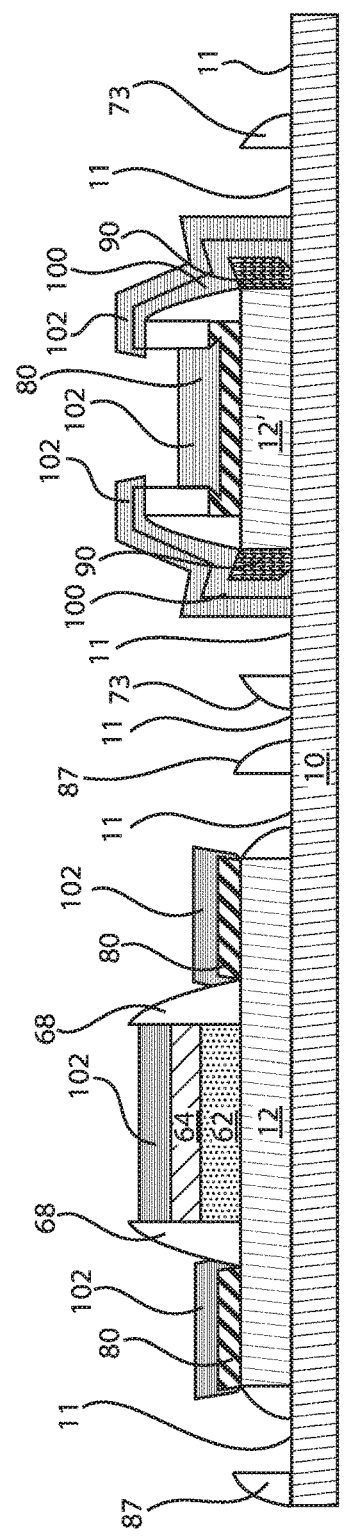
FIG. 21 is a cross-sectional view of the semiconductor device of FIG. 20 where silicide is selectively formed on portions of the HJFET and the HBT, in accordance with an embodiment of the present disclosure.

FIG. 21 is a cross-sectional view of the semiconductor device of FIG. 20 where silicide is selectively formed on portions of the HJFET and the BJT, in accordance with an embodiment of the present disclosure.

In various embodiments, silicide 102 is selectively formed over the HJFET 61 and the BJT 63 in a similar manner as discussed above with reference to FIG. 18.

Figure 22:
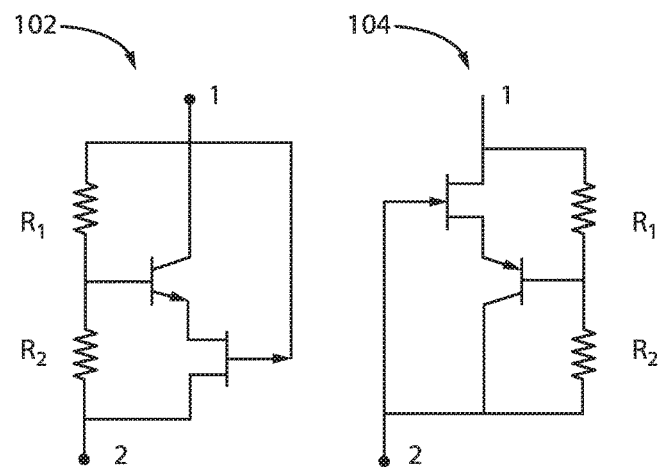
FIG. 22 illustrates an n-channel and a p-channel lambda diode, in accordance with an embodiment of the present disclosure.

FIG. 22 illustrates a p-channel and an n-channel lambda diode, in accordance with an embodiment of the present disclosure.

Circuit 102 represents an example p-channel lambda diode comprised of an n-p-n bipolar transistor and a p-channel junction field-effect transistor, and circuit 104 represents an example n-channel lambda diode comprised of a p-n-p bipolar transistor and an n-channel junction field-effect transistor. A lambda diode is an electronic circuit that combines a pair of bipolar and junction field-effect transistors having a same channel type into a two-terminal device that exhibits an area of differential negative resistance. A complementary pair (e.g., having opposite channel types) of junction field effect transistors can also be used to form a lambda diode circuit in other embodiments. A lambda diode circuit can also include other circuit elements such as passive or active resistors, or additional transistors, as known in the art.

A lambda diode including a junction field-effect transistor (JFET) and a bipolar junction transistor (BJT) is of particular interest because (i) such a lambda diode does not require a large bipolar junction transistor (BJT) gain to produce negative differential resistance (NDR), and therefore low-temperature (laser-crystallized) poly-Si with relatively lower minority carrier lifetime than mono-Si can be used, and (ii) the JFET and the BJT share the same substrate doping type (n or p-type) which is activated during the laser crystallization and no further counter-doping and thermal activation required. In contrast, a complementary JFET pair would require opposite substrate doping types.

Figure 23:
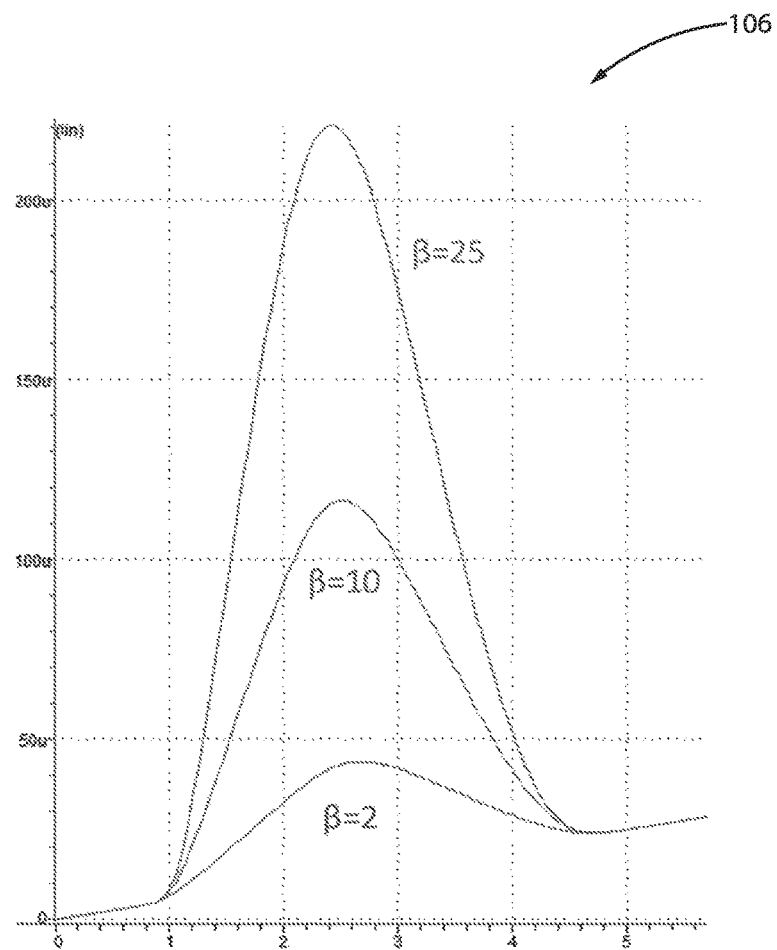
FIG. 23 illustrates a graph of a simulation of an n-channel lambda diode, in accordance with an embodiment of the present disclosure.

FIG. 23 illustrates a graph 106 of a simulation of an n-channel lambda diode including an n-channel junction gate field-effect transistor (JFET), a p-n-p bipolar junction transistor (BJT) and two resistors R1 and R2 (e.g., circuit configuration 104 of FIG. 22), in accordance with an embodiment of the present disclosure.

The simulation is for an n-channel JFET ($V_p \approx -3V$, W/L=1) and p-n-p BJT, where R1=R2=100 KΩ. It is noted that the JFET simulation model was based on experimental data collected from n-channel HJFET devices whereas the device parameters of the p-n-p BJT were varied in the simulation to result in three different bipolar transistor gains ($\beta$) of 2, 10 and 25. It is noted that even a small gain of 2 results in a well-defined NDR region (between approximately 2.6V and 4.6V in this example). Simulation of a p-channel lambda diode (e.g., circuit configuration 102 of FIG. 22) results in a similar graph (not shown).

Figure 24:
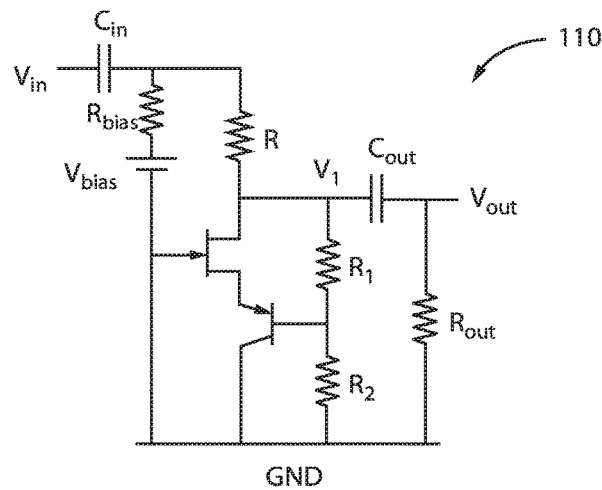
FIG. 24 illustrates an example of a first neuronal circuit implemented by an n-channel lambda diode, in accordance with an embodiment of the present disclosure.

FIG. 24 illustrates an example of a first neuronal circuit 110 implemented using the n-channel lambda diode simulated in FIG. 23 with $\beta$=10, in accordance with an embodiment of the present disclosure.

Figure 26:
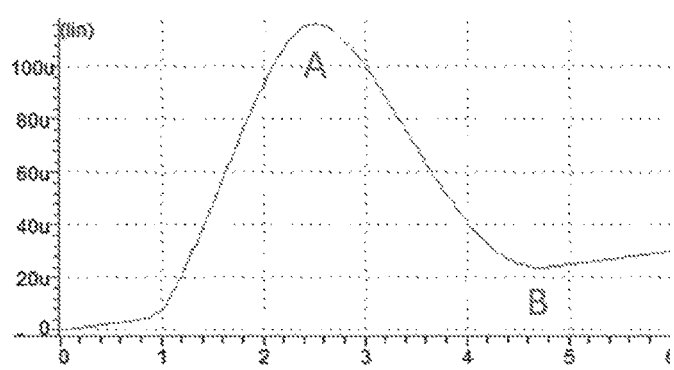
FIG. 26 illustrates an I-V curve of a negative differential resistor (NDR), in accordance with an embodiment of the present disclosure.

R is set to $\approx -(dI/dV)^{-1}$ at the middle of the NDR region (between A and B at approximately 3.5V; see FIG. 26). The DC bias is set close to point A. If the input pulse is higher than a threshold set by bias conditions (0.15-0.2V in this example), the operation point essentially toggles from A to B. This produces the "all-or-nothing" neuronal response. However, this circuit lacks a "refractory" period, during which neuronal response is suppressed. Note that if R were set below $-(dI/dV)^{-1}$ and DC bias in the middle of the NDR region, this circuit would instead function as an amplifier with no threshold.

Figure 25:
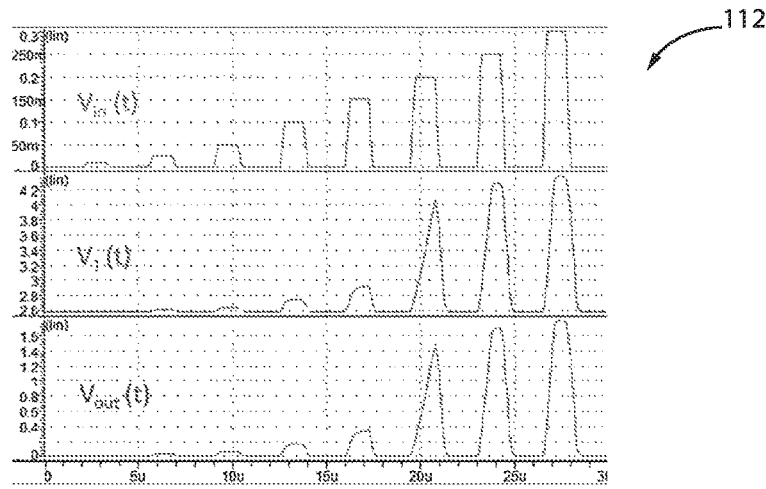
FIG. 25 illustrates voltage graphs resulting from the first neuronal circuit of FIG. 24, in accordance with an embodiment of the present disclosure.

FIG. 25 illustrates voltage graphs 112 resulting from the first neuronal circuit of FIG. 24, in accordance with an embodiment of the present disclosure.

In this simulation R1=R2=100 KΩ, $R_{bias}$=1 KΩ and R=16 KΩ.

FIG. 26 illustrates an I-V curve replot 114 of the n-channel lambda diode simulation I-V curves 104 of FIG. 23 with $\beta$=10.

Figure 27:
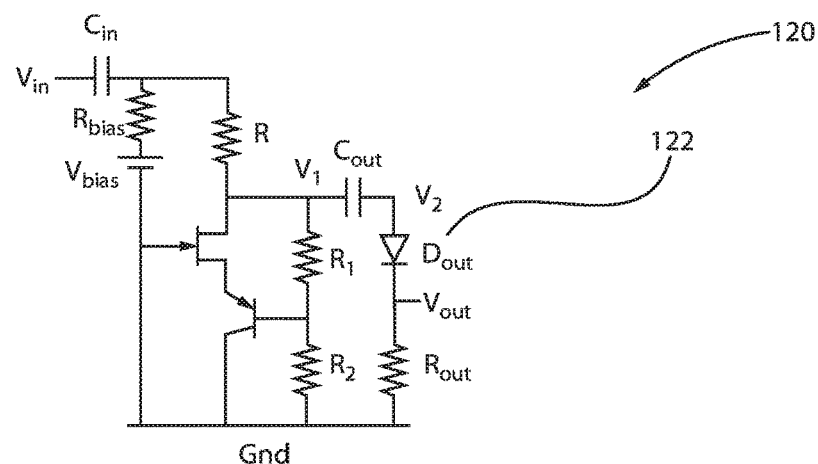
FIG. 27 illustrates an example of a second neuronal circuit implemented by an n-channel lambda diode, in accordance with an embodiment of the present disclosure.

FIG. 27 illustrates an example of a second neuronal circuit implemented using the n-channel lambda diode simulated in FIG. 23 with $\beta$=10, in accordance with an embodiment of the present disclosure.

In the neuronal circuit 110 of FIG. 25, it is assumed that a subthreshold response has no effect on the upstream circuit, e.g., when the output of the neuronal circuit is connected to the gate of a thin film transistor (TFT) having a threshold voltage substantially higher than a magnitude of the subthreshold response. If needed, the subthreshold response can be suppressed using various circuit techniques, e.g., by adding a pass diode ($D_{out}$) 112 in the neuronal circuit of FIG. 27. The diode 122 can be a diode-connected TFT.

Figure 28:
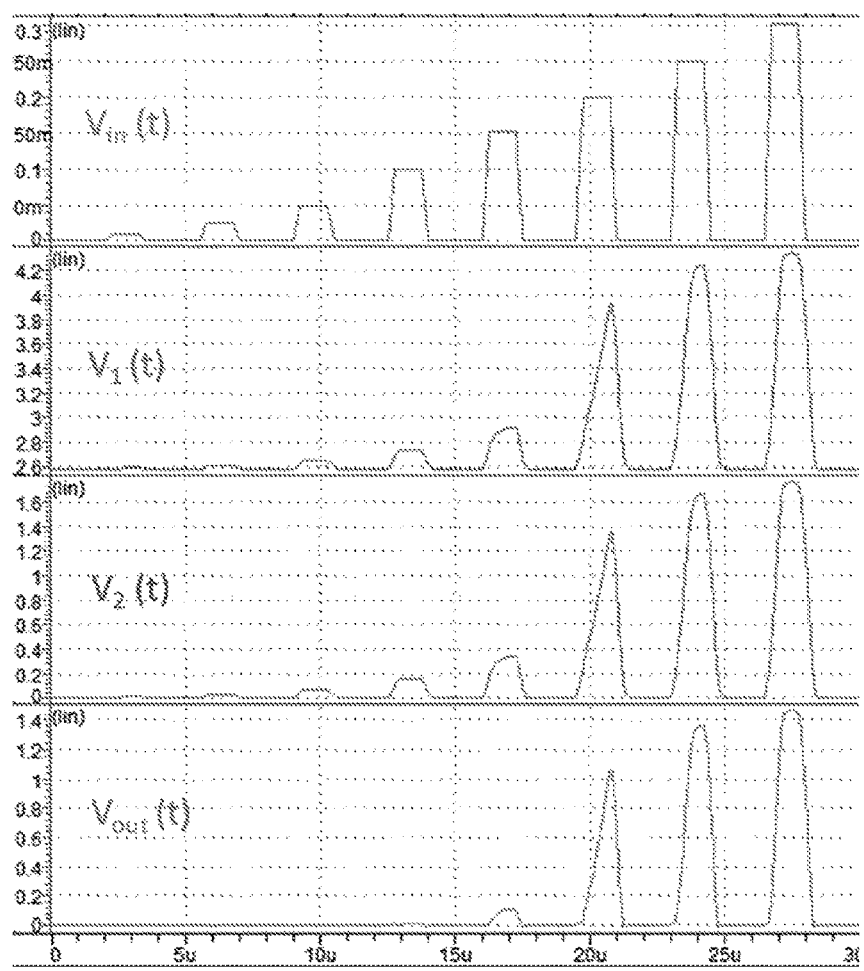
FIG. 28 illustrates voltage graphs resulting from the second neuronal circuit of FIG. 27, in accordance with an embodiment of the present disclosure.

FIG. 28 illustrates voltage graphs 124 resulting from the second neuronal circuit of FIG. 27, in accordance with an embodiment of the present disclosure. It is noted that the subthreshold response of the neuronal circuit 120 is suppressed compared to that of circuit 110.

Figure 29:
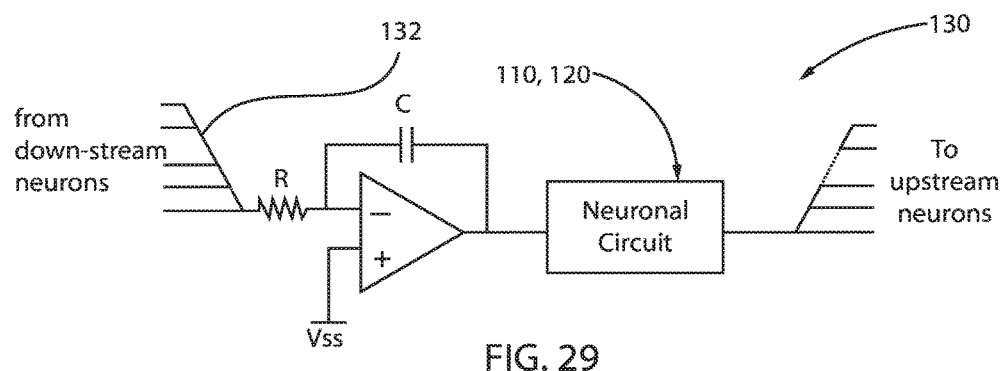
FIG. 29 illustrates incorporation of the neuronal circuit of FIGS. 24, 27 into other circuits, in accordance with an embodiment of the present disclosure.

FIG. 29 illustrates incorporation of the neuronal circuit of FIGS. 24, 27 into a neuromorphic circuit 130, in accordance with an embodiment of the present disclosure.

The neuronal circuits 110, 120 of FIGS. 24, 27 can be used, e.g., in the context shown in FIG. 29. If the sum of signals arriving from downstream neurons 132 is higher than a threshold, the neuronal circuit will fire. The circuits 110, 120 can include pass transistors for synchronized timing (not shown) as well as other electrical elements.

The speed of the neuronal circuits 110, 120 can be adjusted depending on the application. For example, a higher speed can be obtained by increasing the channel width (W) of the JFET and BJT and/or reducing the values of R1 and R2.

To improve temperature stability of the neuronal circuits 110, 120, the resistors R1, R2, and R are preferably implemented as passive resistors rather than diode-connected transistors. Passive resistors can be implemented, e.g., by using a geometrical (lateral) portion of low-temperature poly-Si (typically of the order of 1-10 KΩ/□), or n$^+$ doped a-Si:H (typically of the order of 1-10 MΩ/□). Vertical stacks/via fills can also be used. For example, a Cr/p$^+$ a-Si:H (~20 nm)/Cr stack exhibits a substantially linear resistance of the order of ~10 MΩ.(μm)$^2$. Values 100-1000× lower can be obtained with n$^+$ a-Si:H instead of p$^+$ a-Si:H.

Figure 30:
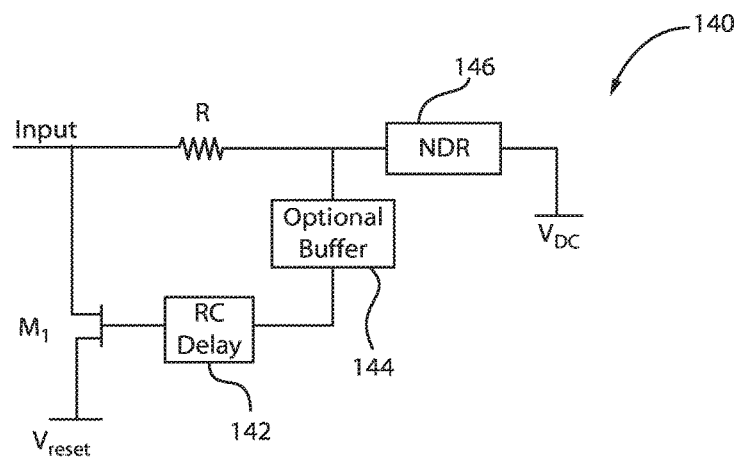
FIG. 30 illustrates an example of a first feedback circuit generating neuronal refractory function, in accordance with an embodiment of the present disclosure.
Figure 31:
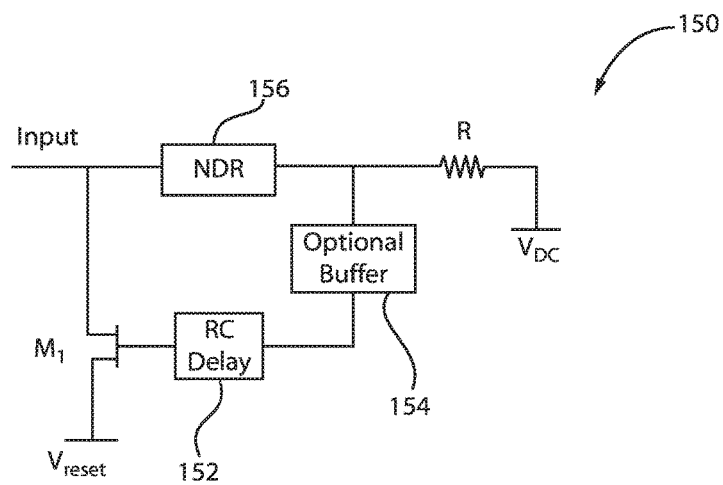
FIG. 31 illustrates an example of a second feedback circuit generating neuronal refractory function, in accordance with an embodiment of the present disclosure.

FIG. 30 illustrates an example of a first feedback circuit 140 implementing neuronal refractory function, and FIG. 31 illustrates an example of a second feedback circuit 150 implementing neuronal refractory function, in accordance with an embodiment of the present disclosure.

Referring to FIGS. 30 and 31, the refractory period can be generated by incorporating one of example feedback circuits 140, 150. Once the neuronal circuit 110, 120 has fired, the feedback circuit 140, 150 connects the input to a reset voltage for a given period corresponding to an equivalent RC delay which can be generated by RC delay blocks 142, 152. This prevents the circuit 140, 150 from firing again, or suppressed firing depending on the time that has elapsed since the firing event. The optional buffer 144, 154, which can provide amplification and/or rectification, can include, e.g., a single transistor or diode. Note the equivalent RC delay of the circuit 140, 150 can be substantially different from that of the RC delay block 142, 152 by itself, especially without an ideal buffer. M1 can be a field-effect or a bipolar transistor and the DC voltage levels can be chosen accordingly for proper transistor operation.

The RC delay blocks 142, 152 can include adjustable voltage ($V_{adjust}$) or elements. For example, a voltage-controlled resistor can be implemented by applying $V_{adjust}$ to the gate or base of a transistor. $V_{adjust}$ can be constant or can be chosen to be a function of the input voltage or another voltage in the neuronal circuit 140, 150 or elsewhere in the system. The feedback circuits 140, 150 also include respective NDRs 146, 156.

Figure 32:
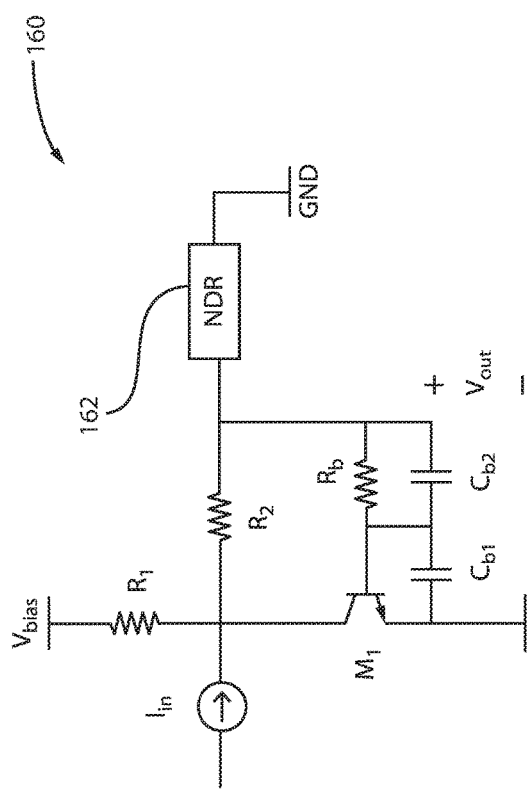
FIG. 32 illustrates an example of a first simulation circuit generating neuronal refractory function, in accordance with an embodiment of the present disclosure.

FIG. 32 illustrates an example of a first simulation circuit 160 implementing a neuronal refractory period utilizing a p-channel NDR 162 in conjunction with a feedback circuit. The flow of ions into a neuron membrane is represented by an input current, $I_{in}$. When $I_{in}$ is larger than a threshold (about 15 µA in this example), the NDR 162 toggles from point A to point B and generates a spike. The spike turns on $M_1$ and toggles the NDR 162 back to point A (the reset voltage $V_M$ is chosen close to the voltage across the NDR 162 at point A) and holds it at point A for a refractory period of approximately $R_b C_{b1}$ by keeping the base-emitter voltage ($V_{be}$) of $M_1$ high. The optional capacitor $C_{b2}$ may be used to damp high-frequency ripples. In one example: $V_{bias}$=4.5V, $V_M$=2.5V, $R_1$=16 KΩ, $R_2$=1 KΩ, $R_b$=100 KΩ, $C_{b1}$=50 pF, $C_{b2}$=5 pF.

Figure 33:
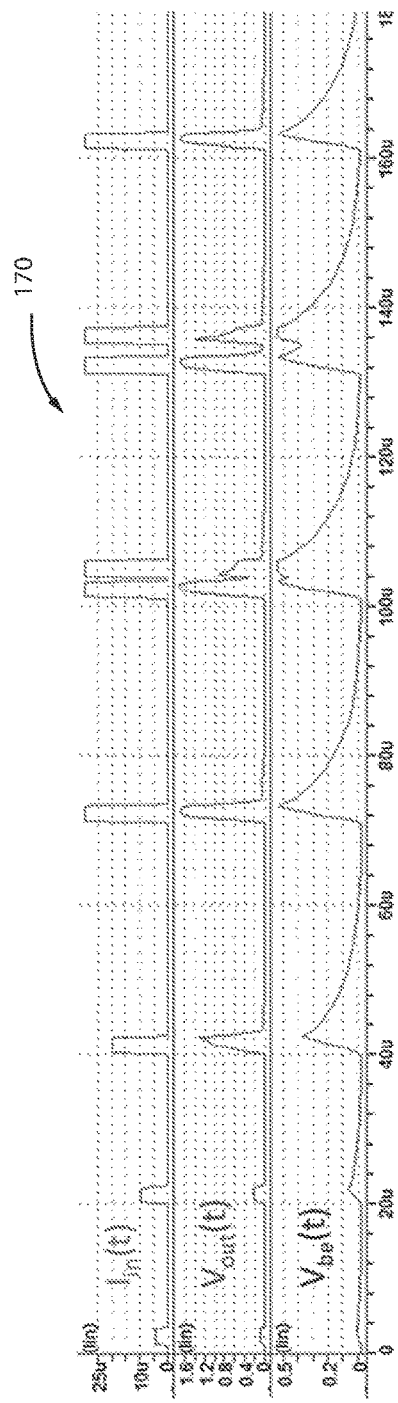
FIG. 33 illustrates current and voltage graphs resulting from the first simulation circuit of FIG. 32, in accordance with an embodiment of the present disclosure.

FIG. 33 illustrates current and voltage graphs 170 resulting from the first simulation circuit of FIG. 32. The presence of a threshold and a refractory period are both evident in the voltage graph.

Figure 34:
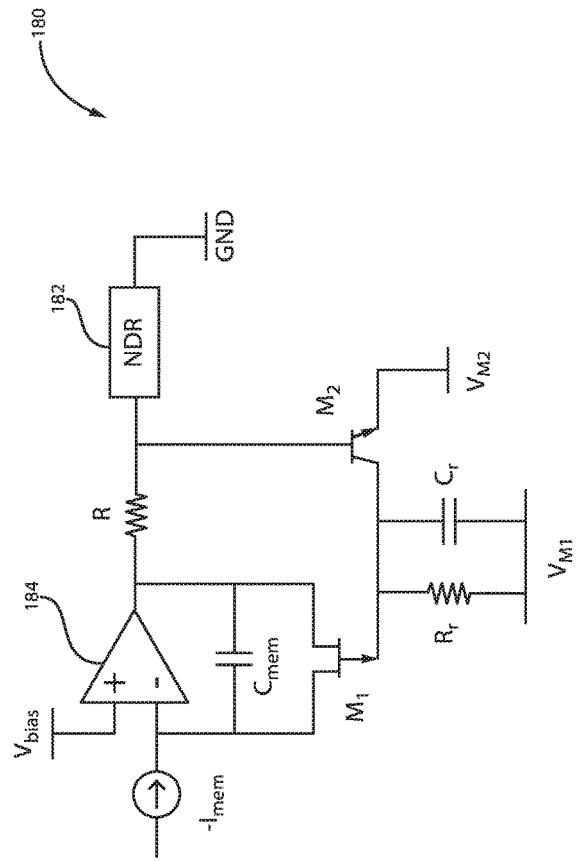
FIG. 34 illustrates an example of a second simulation circuit generating neuronal refractory function, in accordance with an embodiment of the present disclosure.

FIG. 34 illustrates an example of a second simulation circuit 180 implementing a neuronal refractory period utilizing a p-channel NDR 182 in conjunction with a feedback circuit. The integrator (op-amp+$C_{mem}$) represents the neuron membrane accumulating the input signals (ions) received from all the downstream neurons. $I_{mem}$ represents a flow of the ions into the membrane (minus sign was used because the op-amp reverses polarity).

In one example, the op-amp 184 is a simple common-source amplifier including a single JFET. $V_{M2}$ is chosen close to the NDR voltage at point A. $V_{M1}$ is chosen close to and higher than the pinch-off voltage of $M_1$. Therefore, when the NDR 182 toggles from A to B, $M_2$ turns on, prompting $M_1$ to turn on and reset the voltage accumulated across $C_{mem}$.

Figure 35:
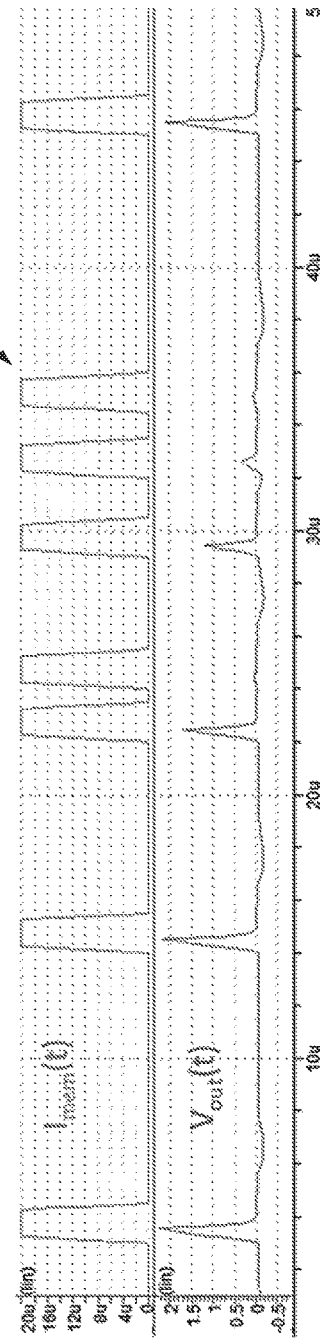
FIG. 35 illustrates current and voltage graphs resulting from the second simulation circuit of FIG. 34, in accordance with an embodiment of the present disclosure.

In one example: $V_{bias}$=4.5V, $V_{M1}$=3.5V, $V_{M2}$=2.5V, R=17KΩ, $C_{mem}$=5 pF FIG. 35 illustrates current and voltage graphs 190 resulting from the second simulation circuit of FIG. 34.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_x Ge_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of a method of forming a thin-film negative differential resistance and neuronal circuit (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A monolithically integrated pair of semiconductor devices on an insulating substrate, comprising:
   a heterojunction field-effect transistor (HJFET) including first hydrogenated silicon-based contacts disposed on a first portion of a semiconductor material of the insulating substrate; and
   a heterojunction bipolar transistor (HBT) including second hydrogenated silicon-based contacts disposed on a second portion of the semiconductor material of the insulating substrate;
   wherein a portion of multi-layer source and drain contacts of the HJFET and a multi-layer base contact of the HBT include a same material, and a portion of multi-layer emitter and collector contacts of the HBT partially overlap all of the conductive layers of the multi-layered base contact and a multi-layer gate contact of the HJFET partially overlaps the multi-layer source and drain contacts;
   wherein the HJFET and the HBT are integrated to create negative differential resistance by forming a lambda diode.

2. The semiconductor devices of claim 1, wherein the first hydrogenated silicon-based contacts are intrinsic amorphous hydrogenated silicon contacts and the second hydrogenated silicon-based contacts are heavily-doped amorphous hydrogenated silicon contacts having a doping type opposite to that of the semiconductor material.

3. The semiconductor devices of claim 1, wherein the first and second hydrogenated silicon-based contacts are grown by plasma-enhanced chemical vapor deposition (PECVD).

4. The semiconductor devices of claim 1, wherein the lambda diode is part of a neuronal circuit.

5. The semiconductor devices of claim 1, wherein the multi-layer source and drain contacts of the heterojunction field-effect transistor and the multi-layer base contact of the heterojunction bipolar transistor include a same material, and the multi-layer emitter and collector contacts of the heterojunction bipolar transistor and the multi-layer gate contact of the heterojunction field-effect transistor include a same material.

* * * * *